(12) United States Patent
Abbata et al.

(10) Patent No.: US 6,338,029 B1
(45) Date of Patent: Jan. 8, 2002

(54) METHOD FOR DETERMINING WHEN AN ELECTRIC MOTOR IS ACCEPTABLE

(75) Inventors: Salvatore A. Abbata, Webster; Robert P. Siegel, Penfield, both of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/337,474

(22) Filed: Jun. 21, 1999

(51) Int. Cl.[7] .............................. G07C 3/08; G06F 15/00
(52) U.S. Cl. ...................... 702/183; 702/187; 702/33; 702/34; 324/545; 318/434; 318/700; 318/798
(58) Field of Search ........................... 702/183, 42, 32, 702/187, 33, 34; 318/490, 434, 806, 775, 705, 720, 778, 798, 812; 324/722, 545, 558, 76.21; 73/662

(56) References Cited

U.S. PATENT DOCUMENTS 4,839,830 A * 6/1989 Amey et al. .................. 702/42
5,629,870 A * 5/1997 Farag et al. ................. 324/558
5,680,025 A * 10/1997 Bowers, III et al. ........ 318/806
5,729,911 A * 3/1998 Canada et al. ................ 702/32

* cited by examiner

Primary Examiner—Marc S. Hoff
Assistant Examiner—Hien Vo
(74) Attorney, Agent, or Firm—Wayne J. Egan

(57) ABSTRACT

A testing apparatus determines when an electric motor is acceptable based on measured parameters and fuzzy logic. The testing apparatus measures the following motor parameters: a time for the motor to reach a running speed in a steady-state, thus forming a time-to-speed; a difference between an instantaneous speed and an average speed in the steady-state, thus forming a speed variation; a maximum value of the motor current, thus forming a maximum current; a motor current in the steady-state, thus forming a running current; and a motor vibration energy in the steady-state, thus forming a vibration energy. Based on the measured motor parameters, the testing apparatus then uses fuzzy logic to determine when the motor is acceptable.

28 Claims, 7 Drawing Sheets

METHOD FOR DETERMINING WHEN AN ELECTRIC MOTOR IS ACCEPTABLE

INCORPORATION BY REFERENCE OF OTHER U.S. PATENTS

The applicant hereby incorporates by reference the disclosures of Robert P. Siegel et al., "Predictive fuser misstrip avoidance system and method," U.S. Pat. No. 5,406,363, and Robert P. Siegel et al., "Predictive decurler apparatus and method," U.S. Pat. No. 5,414,503, verbatim and with the same effect as though such disclosures were fully and completely set forth herein.

FIELD OF THE DISCLOSURE

This disclosure relates generally to electric motors and, in particular, to a method for determining when an electric motor is acceptable.

BACKGROUND OF THE INVENTION

Electric motors are commonly used in many devices and machines. For example, a copying machine uses a plurality of motors for various applications. One such application is for driving feed rollers for conveying a sheet of paper through a copying machine paper path for processing by the various copying functions.

Typically machines are returned to their manufacturer for service. When this occurs, it is common to remove the various motors from the machine. After removal, each motor is analyzed to determine if it is in acceptable condition to be re-used. The problem, therefore, is how to test an electric motor and determine its acceptability in an efficient manner.

Present methods of motor testing generally involve a "one parameter at a time" approach. Each parameter is measured and a determination is made to accept or reject the motor with respect to each parameter independently. For example, numerous motor testing methods are based on vibration analysis and current signature analysis. These methods are adequate when distinct defects are present, for example when looking for defects in a new production environment or in a field service troubleshooting situation where a problem has been reported. These methods are effective in detecting "hard failures" where the motor in question has departed in a clear and dramatic way from a known acceptable state.

The existing methods, however, do not address the case of a "soft is failure" where a motor is still performing its intended function, but has experienced a more subtle degree of degradation.

Therefore, there is a need for an improved method for determining when an electric motor is acceptable.

SUMMARY OF THE INVENTION

In one aspect of the invention, a testing apparatus is arranged for coupling to a motor. The testing apparatus determines when the motor is acceptable in accordance with a method. The method comprises: a) measuring a time required for the motor to reach a running speed in a steady state, thus forming a time-to-speed parameter; b) measuring a difference between an instantaneous speed and an average speed in the steady state, thus forming a speed variation parameter; c) measuring a maximum value of the motor current, thus forming a maximum current parameter; d) measuring a motor current in the steady state, thus forming a running current parameter; e) measuring a motor vibration energy in the steady state, thus forming a vibration energy parameter; and f) determining when the motor is acceptable based on the time-to-speed parameter, the speed variation parameter, the maximum current parameter, the running current parameter and the vibration energy parameter.

In another aspect of the invention, a testing apparatus is arranged for coupling to a motor. The testing apparatus determines when the motor is acceptable in accordance with a method. The method comprises: a) measuring a time required for the motor to reach a running speed in a steady state, thus forming a time-to-speed parameter; b) measuring a difference between an instantaneous speed and an average speed in the steady state, thus forming a speed variation parameter; c) measuring a maximum value of the motor current, thus forming a maximum current parameter; d) measuring a motor current in the steady state, thus forming a running current parameter; e) measuring a motor vibration energy in the steady state, thus forming a vibration energy parameter; f) measuring a motor current energy in the steady state, thus forming a current energy parameter; and g) determining when the motor is acceptable based on the time-to-speed parameter, the speed variation parameter, the maximum current parameter, the running current parameter, the vibration energy parameter and the current energy parameter.

DESCRIPTION OF THE PREFERRED EMBODIMENTS

Figure 1:
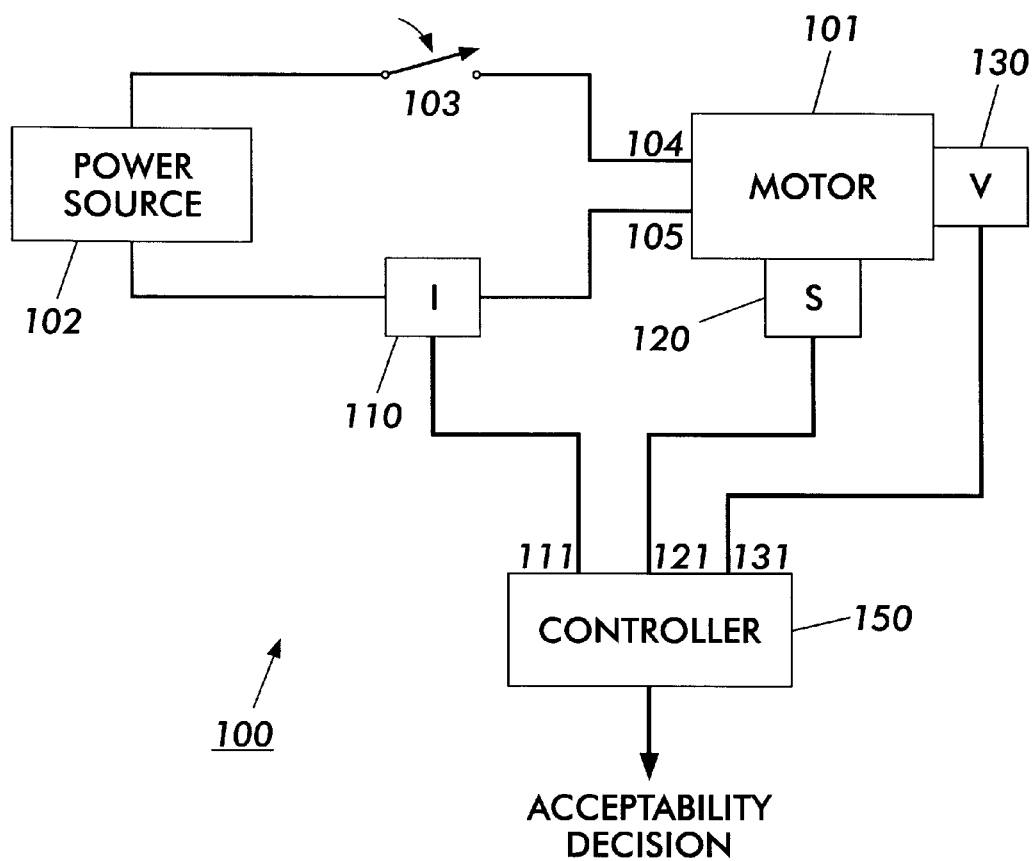
FIG. 1 depicts a testing apparatus coupled to a motor.

Referring now to FIG. 1, there is shown a testing apparatus 100 arranged for coupling to a motor 101. The apparatus includes a power source 102 coupled to a switch 103. With the switch 103 open circuited, power 102 is removed and the motor is in an "off" state. When the switch 103 is activated, power is applied to the motor's power input terminals 104, 105, thus setting the motor to an "on" state. As the motor begins operating, its speed increases from an initial resting condition of zero (0) revolutions-per-minute ("RPM") until reaching a steady-state running condition. Three sensors 110, 120, and 130 are arranged to measure various parameters of the motor 101 during the motor's transition from "off" to steady-state, First, a current sensor 110 (labeled "I" for current) measures the motor's current drawn from the power source 102. As the current is measured, the first sensor 110 provides a signal 111 representing this first motor parameter to a controller 150.

Second, a speed sensor 120 (labeled "S" for speed) measures the motor's speed. As the speed is measured, the second sensor 120 provides a signal 121 representing this second motor parameter to the controller 150.

Third, a vibration sensor 130 (labeled "V" for vibration) measures the motor's vibration. As the vibration is measured, the third sensor 130 provides a signal 131 representing this third motor parameter to the controller 150.

As explained in greater detail below, the controller 150 analyzes motor parameter information based on the three signals 111, 121 and 131 to determine the acceptability of the motor 101. The controller 150 then provides an acceptability decision 199 based on the parameters.

In one embodiment, the controller 150 comprises a suitably-programmed processor such as, for example, a personal computer ("PC"). The acceptability decision 199 comprises a "YES" (for acceptable) or "NO" (for not acceptable) message, or other suitable PASS or FAIL indication, as displayed on a computer display screen.

FIGS. 2–5 depict various parameters of the motor 101 as analyzed by the controller 150. In each figure, the various parameters are depicted with respect to time, with the origin representing the time (at t=0) when the switch 103 is activated to turn the motor "on".

Figure 6:
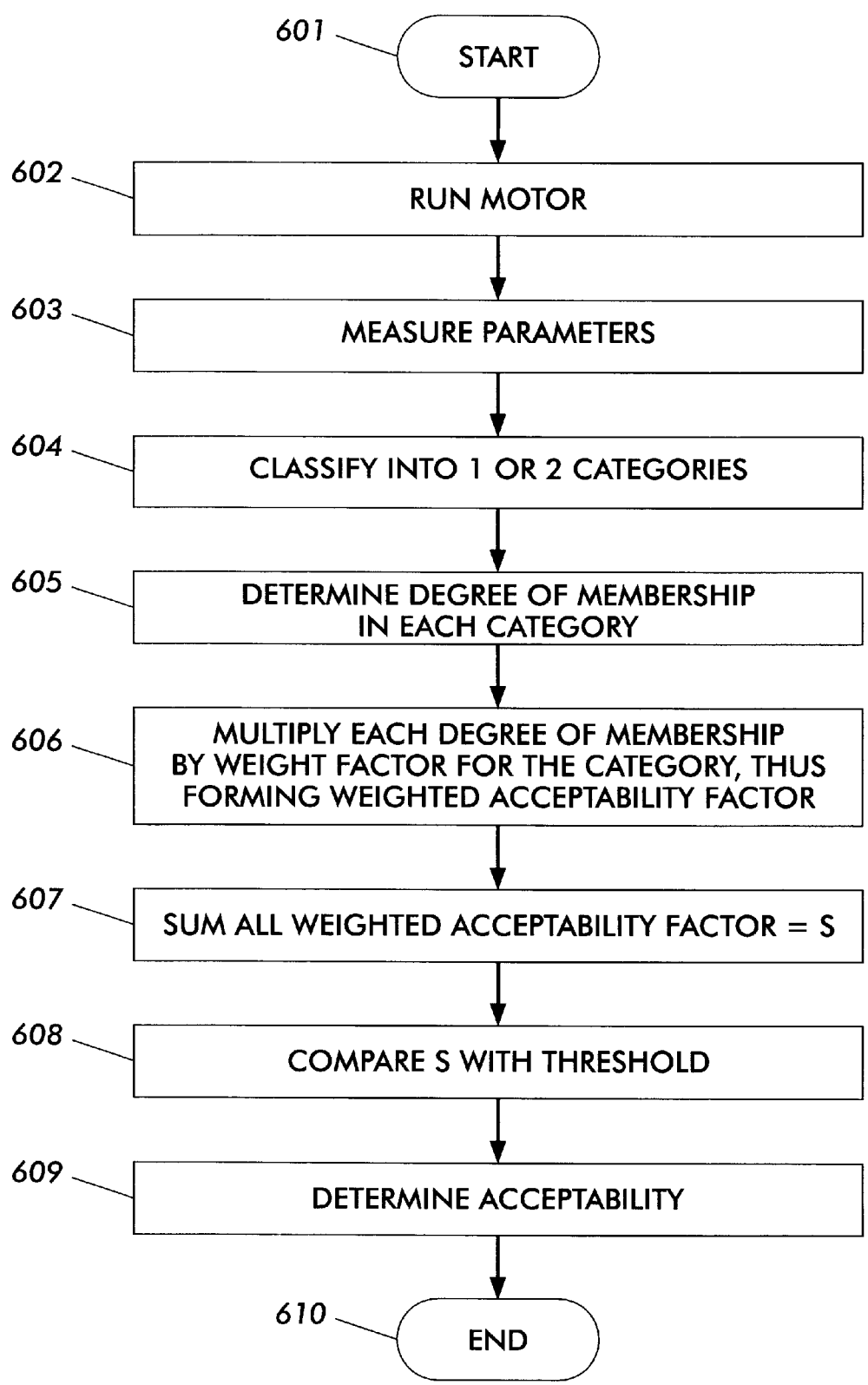
FIG. 6 is a flow diagram followed by the FIG. 1 testing apparatus.

The process followed by the FIG. 1 testing apparatus is shown in the flow diagram of FIG. 6.

Referring now to FIG. 6, the process starts, step 601, and then proceeds to run the motor, step 602.

In step 603, the process measures various parameters of the motor, the parameters being depicted in FIGS. 2–5. These parameters comprise time-to-speed, speed variation, maximum current, running current, and vibration energy, as described below.

Figure 2:
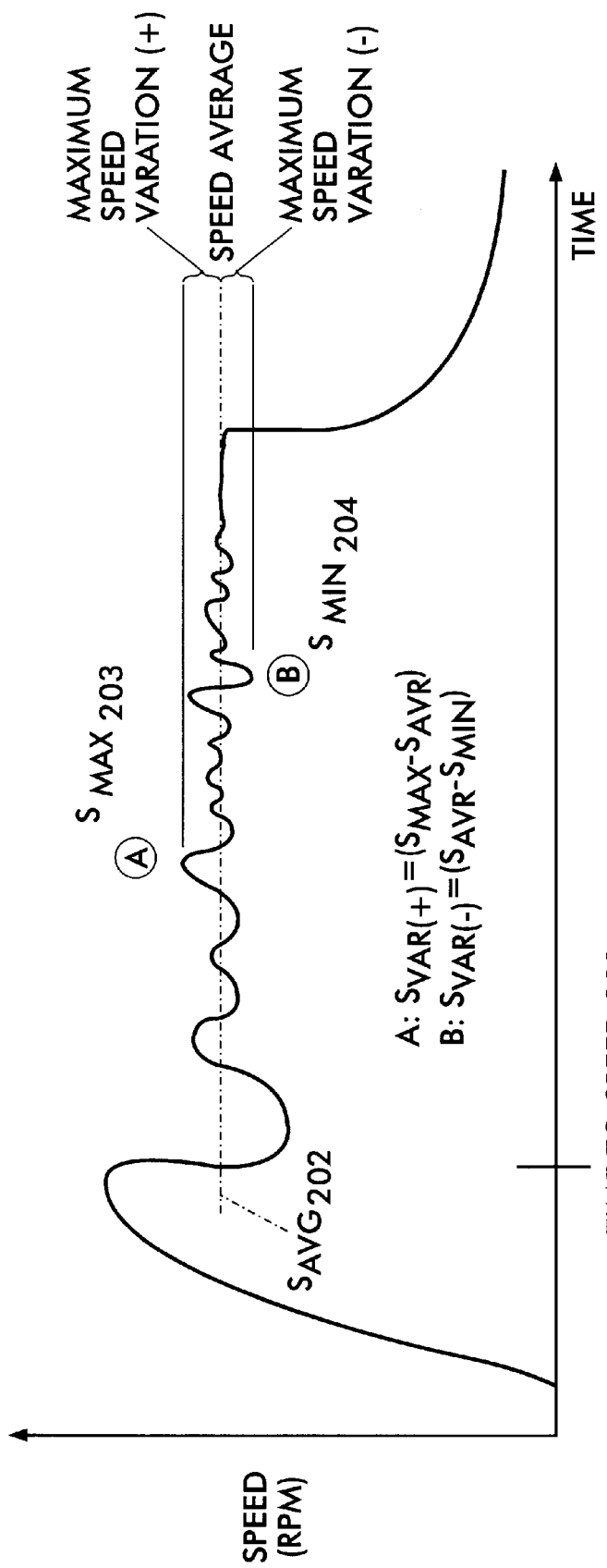
FIG. 2 depicts a speed of the motor with respect to time.

Referring to FIG. 2, there is depicted the motor's speed (in RPM) with respect to time. The process measures a time required for the motor to reach a running speed in a steady state, thus forming the time-to-speed parameter depicted as element 201. Also, the process measures a difference between an instantaneous speed and an average speed in the steady state, depicted as element 202, thus forming the speed variation parameter. The speed variation parameter includes a maximum speed variation parameter 203 and a minimum speed variation parameter 204.

Figure 3:
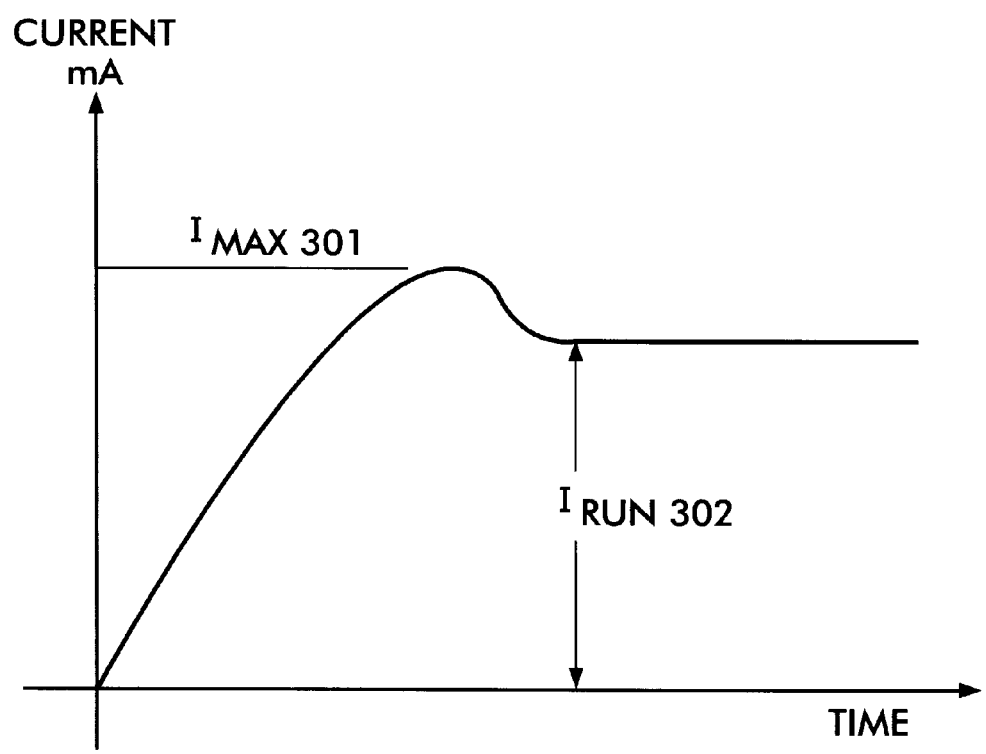
FIG. 3 depicts a current of the motor with respect to time.

Referring to FIG. 3, there is depicted the motor's current (in Amperes) with respect to time. The process measures a maximum value of the motor current, thus forming the maximum current parameter, depicted as element 301. Also, the process measures a motor current in the steady state, thus forming the running current parameter, depicted as element 302.

Figure 4:
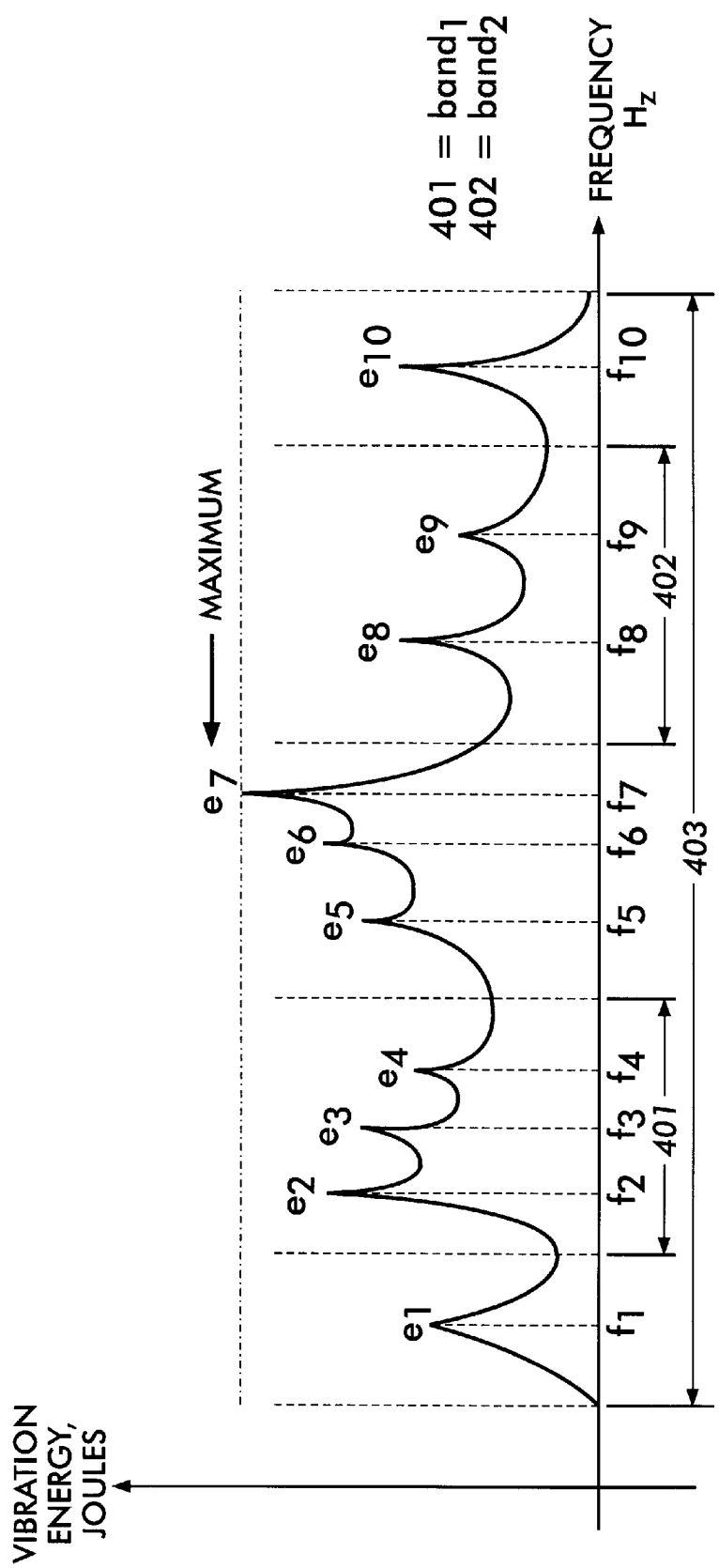
FIG. 4 depicts a vibration energy of the motor with respect to time.

Referring to FIG. 4, there is depicted the motor's vibration energy (in Joules) with respect to frequency. The process measures a motor vibration energy in the steady state, thus forming the vibration energy parameter.

In one embodiment, the vibration energy parameter includes a band vibration energy parameter for each frequency band of a predetermined set of frequency bands. In FIG. 4, for example, a typical predetermined set of frequency bands is depicted as the two frequency bands 401 and 402.

In another embodiment, the band vibration energy parameter comprises a total band vibration energy parameter.

In a further embodiment, the predetermined set of frequency bands comprises an arbitrary quantity of frequency bands.

In still another embodiment, the band vibration energy parameter includes an average band vibration energy parameter based on an average vibration energy of each frequency band.

In a still further embodiment, the band vibration energy parameter includes a peak band vibration energy parameter based on vibration energy peaks of each frequency band. In FIG. 4, for example, frequency band 401 comprises three vibration energy peaks designated e2, e3 and e4, whereas frequency band 402 comprises two vibration energy peaks designated e8 and e9.

In yet another embodiment, the vibration energy parameter includes a spectrum vibration energy parameter for a predetermined frequency spectrum. In FIG. 4, for example, the predetermined frequency spectrum is depicted as element 403.

In a yet further embodiment, the spectrum vibration energy parameter includes a peak spectrum vibration energy parameter based on vibration energy peaks of the frequency spectrum. In FIG. 4, for example, the frequency spectrum 403 includes ten vibration energy peaks designated e1 through e10.

In a still yet another embodiment, the spectrum vibration energy parameter includes a maximum spectrum vibration energy parameter based on the maximum vibration energy of the frequency spectrum. In FIG. 4, for example, the maximum vibration energy of the frequency spectrum 403 comprises vibration energy peak e7.

Returning now to FIG. 6, in the six (6) steps 604 through 609, the process determines when the motor 101 is acceptable based on the foregoing parameters, namely, the time-to-speed parameter, the speed variation parameter, the maximum current parameter, the running current parameter and the vibration energy parameter. These steps are based on well-known "fuzzy logic" described, for example, in the first above-referenced U.S. Pat. No. 5,406,363 to Robert P. Siegel et al., especially FIGS. 2A, 2B and 2C and the text corresponding thereto. Another example of fuzzy logic is described in the second above-referenced U.S. Pat. No. 5,414,503 to Robert P. Siegel et al., especially FIGS. 2A, 2B and 2C and the text corresponding thereto.

In step 604, based on the measured value of the parameter, the process classifies each parameter of the set of parameters comprising time-to-speed, speed variation, maximum current, running current and vibration energy into one or two categories. The one or two categories are members of a predetermined set of categories, with each member of the set of categories having a predetermined weight factor corresponding thereto. As explained more fully below, the set of categories and corresponding weight factors comprise predetermined relationships depicted in FIG. 7.

In step 605, for each parameter classified into one category, the process determines a degree of membership in the category. Also in step 605, for each parameter classified into two categories comprising a first category and a second category, the process determines a first degree of membership in the first category and a second degree of membership in the second category. As explained more fully below, the degrees of membership comprise predetermined relationships depicted in FIG. 7.

In step 606, for each parameter classified into one category, the process forms a weighted acceptability factor based on the product of the degree of membership and the weight factor corresponding to the category. Also in step 606, for each parameter classified into two categories comprising a first category and a second category, the process forms a first weighted acceptability factor based on the product of the first degree of membership and the weight factor corresponding to the first category, and a second weighted acceptability factor based on the second degree of membership and the weight factor corresponding to the second category.

Figure 7:
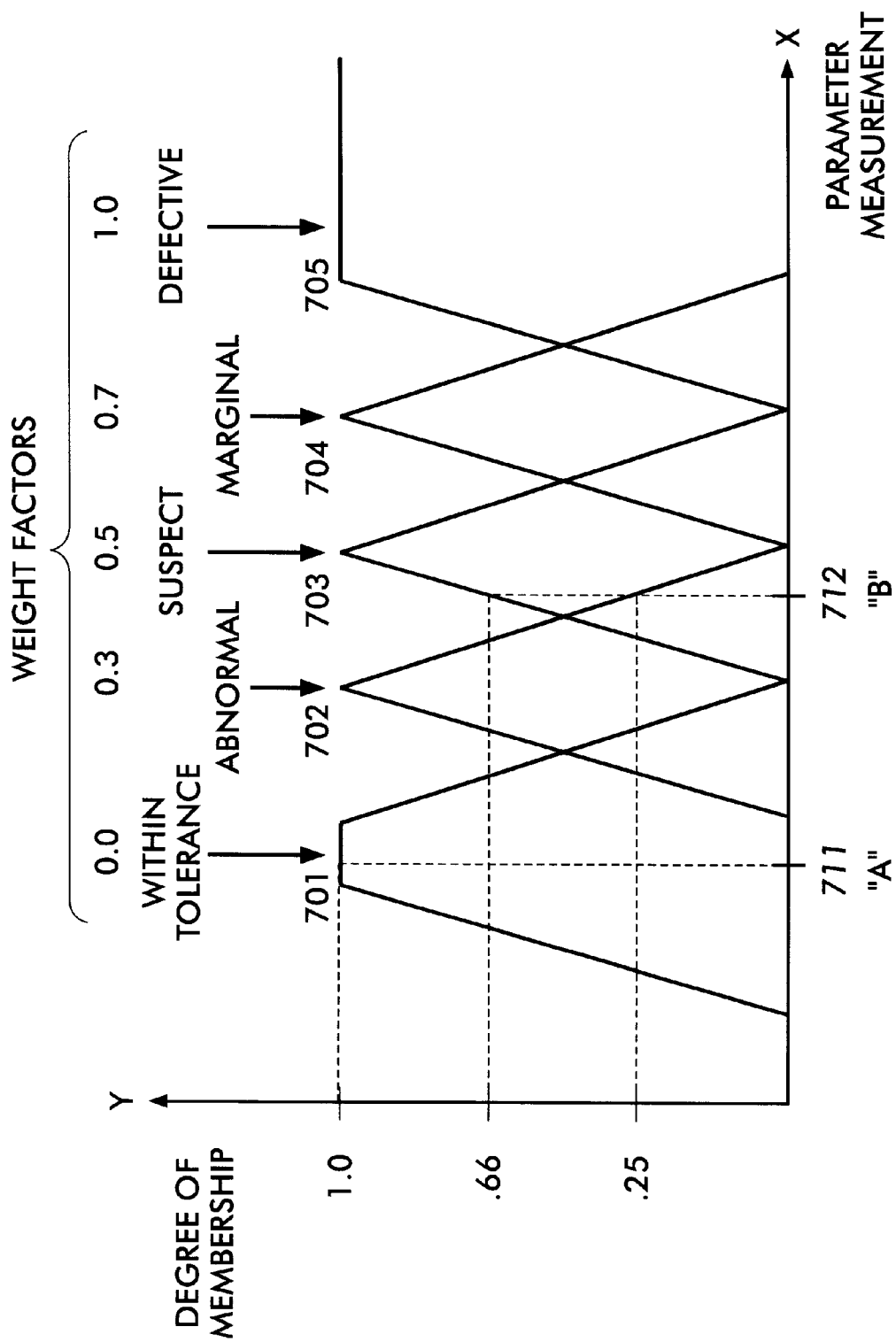
FIG. 7 depicts fuzzy logic relationships used by the FIG. 6 flow diagram.

The set of categories, corresponding weight factors and degrees of membership in steps 604, 605 and 606 are depicted in FIG. 7.

Referring to FIG. 7, there is shown a set of five (5) categories 701–705, each category having a corresponding weight factor depicted above the category. Hence, category 701, labeled "within tolerance," has a weight factor of 0.0; category 702, labeled "abnormal," has weight factor of 0.3; category 703, labeled "suspect," has a weight factor of 0.5; category 704, labeled "marginal," has a weight factor of 0.7; and category 705, labeled "defective," has a weight factor of 1.0. Based on a parameter's measured value, as shown by the X axis, the parameter is classified into one or two categories of the set of categories 701–705. The Y-axis shows the degree of membership for each category.

Referring still to FIG. 7, the foregoing steps 604–606 are illustrated by the following exemplary discussions of hypothetical parameter values "A" and "B".

Hypothetical parameter value "A", corresponding to the FIG. 7 X-axis point 711, is a member of only one category, namely, "within tolerance" category 701 (step 604). The degree of membership is given by the FIG. 7 Y-axis as 1.0 (step 605). As shown in FIG. 7, the corresponding weight factor for category 701 is 0.0. Hence, the weighted acceptability factor for parameter value "A" is computed as 1.0 (degree of membership) multiplied by 0.0 (weight factor), thus 0 (zero) (step 606).

In contrast, hypothetical parameter value "B", corresponding to the FIG. 7 X-axis point 712, is a member of two categories, namely, a first "abnormal" category 702 and a second "suspect" category 703 (step 604).

For parameter value "B", the first degree of membership in the first category 702 is given by the FIG. 7 Y-axis as 0.25, and the second degree of membership in the second category 703 is given by the Y-axis as 0.66 (step 605).

Also for parameter value "B", as shown in FIG. 7, the first weight factor corresponding to the first category 702 is 0.3. Hence, the first weighted acceptability factor for parameter value "B" is computed as 0.25 (first degree of membership) multiplied by 0.3 (first weight factor), thus 0.075 (step 606). The second weight factor corresponding to the second category 703 is 0.5. Hence, the second weighted acceptability factor for parameter value "B" is computed as 0.66 (second degree of membership) multiplied by 0.5 (second weight factor), thus 0.33 (step 606).

Returning to FIG. 6, in step 607 the process sums all weighted acceptability factors formed in step 606, thus forming a composite acceptability score for the motor (labeled "S").

In step 608, the process compares the composite acceptability score ("S") with a predetermined threshold ("T"), thus forming a comparison. In one embodiment, the process determines when S<T.

In step 609, based on the comparison in step 608, the process determines when the motor is acceptable. In one embodiment, the process determines that the motor is acceptable when S<T.

The process then ends, step 610.

Still referring to FIG. 6, in another embodiment the parameter measuring step 603 measures one additional parameter for the motor 101, namely, a motor current energy.

Figure 5:
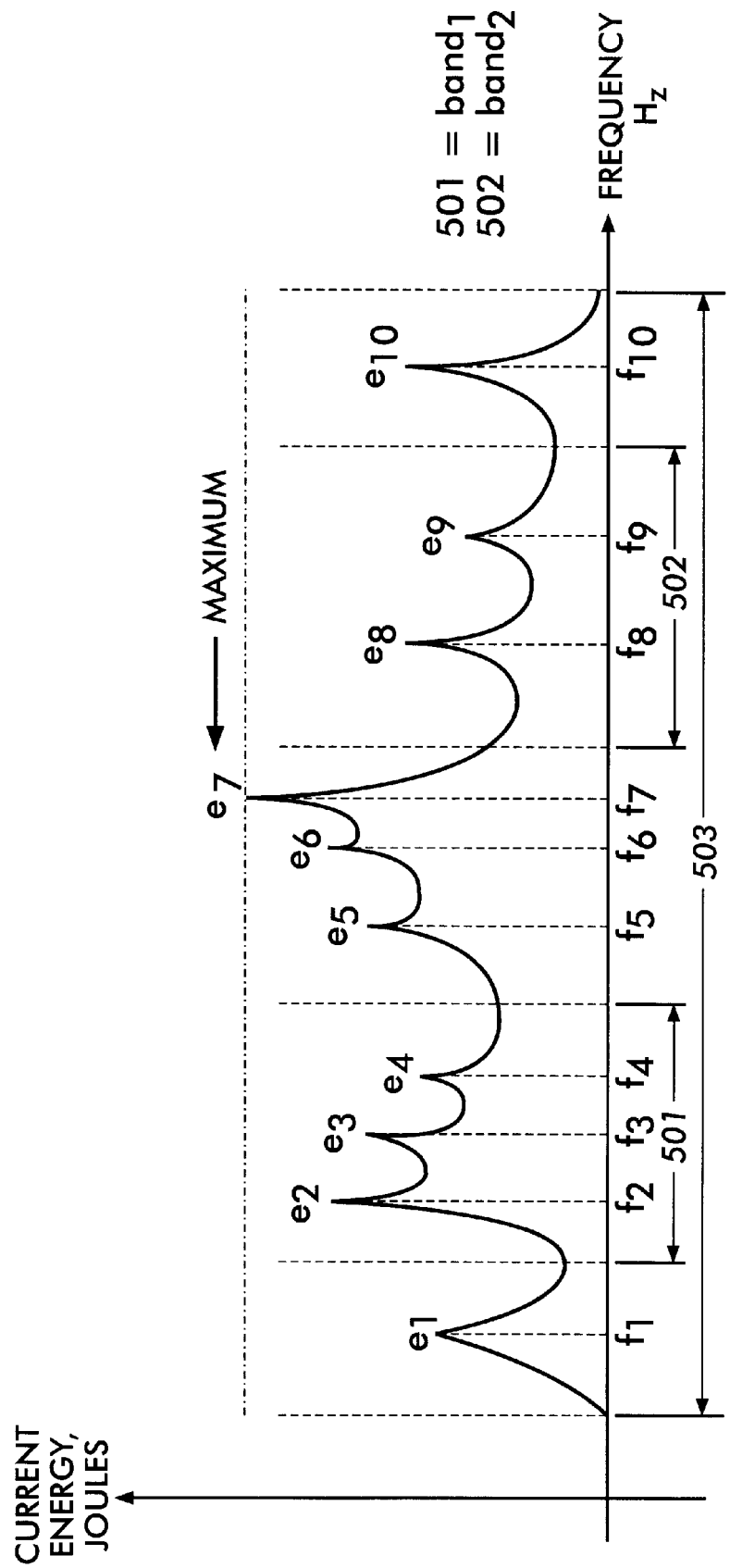
FIG. 5 depicts a current energy of the motor with respect to time.

Referring to FIG. 5, there is depicted the motor's current energy (in Joules) with respect to frequency. Step 603 measures the motor current energy in the steady state, thus forming a current energy parameter. Moreover, in this embodiment steps 604 through 609 use this additional motor parameter of current energy, together with the motor parameters described above, namely, time-to-speed, speed variation, maximum current, running current and vibration energy, in order to determine when the motor is acceptable.

In one embodiment, the current energy parameter includes a band current energy parameter for each frequency band of a predetermined set of frequency bands. In FIG. 5, for example, a typical predetermined set of frequency bands is depicted as the two frequency bands 501 and 502.

In another embodiment, the band current energy parameter comprises a total band current energy parameter.

In a further embodiment, the predetermined set of frequency bands comprises an arbitrary quantity of frequency bands.

In still another embodiment, the band current energy parameter includes an average band current energy parameter based on an average current energy of each frequency band.

In a still further embodiment, the band current energy parameter includes a peak band current energy parameter based on current energy peaks of each frequency band. In FIG. 5, for example, frequency band 501 comprises three current energy peaks designated e2, e3 and e4, whereas frequency band 502 comprises two current energy peaks designated e8 and e9.

In yet another embodiment, the current energy parameter includes a spectrum current energy parameter for a predetermined frequency spectrum. In FIG. 5, for example, the predetermined frequency spectrum is depicted as element 503.

In a yet further embodiment, the spectrum current energy parameter includes a peak spectrum current energy parameter based on current energy peaks of the frequency spectrum. In FIG. 5, for example, the frequency spectrum 503 includes ten current energy peaks designated e1 through e10.

In a still yet another embodiment, the spectrum current energy parameter includes a maximum spectrum current energy parameter based on the maximum current energy of the frequency spectrum. In FIG. 5, for example, the maximum current energy of the frequency spectrum 503 comprises current energy peak e7.

In one embodiment, the present invention comprises a computer program that is resident in a PC. The computer program may be implemented in a variety of suitable computer languages. One particular computer program was created using the "LabVIEW" computer language as described in the publication "LabVIEW User Manual," January 1996 edition, available from National Instruments Corporation as Part Number 320999A-01.

In practice, the present invention's integration of the weighted measured motor parameters into a composite acceptability score has proven to be an effective method to determine a motor's health, that is, the motor's ability to perform satisfactorily for at least one more machine life cycle. The lower the composite acceptability score, the healthier the motor for purposes of reuse. Conversely, any motor having a composite acceptability score exceeding the predetermined threshold is deemed to constitute a failure, to be discarded.

In contrast to the prior art, which only addressed "hard failures," the present invention also addresses the case of a "soft failure" where a motor is still performing its intended function, but has experienced some subtle degree of degradation. Moreover, the present invention provides a composite assessment of the condition of the motor which is particularly useful in a situation such as a refurbishing or asset recovery, where it is important to assess the degree of degradation of the motor.

Further, the present invention provides an increases understanding of the motor's overall condition. Also, the invention improves the determination of a motor's health by increasing the ability to detect subtle motor degradations, improving the predictability of the motor's remaining life, improving the assessment accuracy of the motor's condition and increasing accuracy in determining the motor's degradation.

Moreover, as a result of increased accuracy in determining a motor's health, in the long run, more healthy motors are selected for reuse while more unhealthy motors are discarded. As a result of this improved motor selection, the reliability of reused motors increases, while failures and corresponding maintenance costs of reused motors decrease.

While various embodiments of a method for determining when an electric motor is acceptable, in accordance with the present invention, have been described above, the scope of the invention is defined by the following claims.

What is claimed is:

1. In testing apparatus arranged for coupling to a motor, the motor including a motor current, a method for determining when the motor is acceptable, the method comprising:
    a) measuring a time required for the motor to reach a running speed in a steady state, thus forming a time-to-speed parameter,
    b) measuring a difference between an instantaneous speed and an average speed in the steady state, thus forming a speed variation parameter,
    c) measuring a maximum value of the motor current, thus forming a maximum current parameter,
    d) measuring a motor current in the steady state, thus forming a running current parameter,
    e) measuring a motor vibration energy in the steady state, thus forming a vibration energy parameter, and
    f) determining when the motor is acceptable based on the time-to-speed parameter, the speed variation parameter, the maximum current parameter, the running current parameter and the vibration energy parameter.

2. The method of claim 1, the vibration energy measuring step e) including measuring a band vibration energy for each frequency band of a predetermined set of frequency bands.

3. The method of claim 2, the band vibration energy comprising a total band vibration energy.

4. The method of claim 2, the predetermined set of frequency bands comprising an arbitrary quantity of frequency bands.

5. The method of claim 4, the band vibration energy including an average band vibration energy based on an average vibration energy of the each frequency band.

6. The method of claim 4, the band vibration energy including a peak band vibration energy based on vibration energy peaks of the each frequency band.

7. The method of claim 1, the vibration energy measuring step e) including measuring a spectrum vibration energy for a predetermined frequency spectrum.

8. The method of claim 7, the spectrum vibration energy including a peak spectrum vibration energy based on vibration energy peaks of the frequency spectrum.

9. The method of claim 7, the spectrum vibration energy including a maximum spectrum vibration energy based on the maximum vibration energy of the frequency spectrum.

10. In testing apparatus arranged for coupling to a motor, the motor including a motor current, a method for determining when the motor is acceptable, the method comprising:
    a) measuring a time required for the motor to reach a running speed in a steady state, thus forming a time-to-speed parameter,
    b) measuring a difference between an instantaneous speed and an average speed in the steady state, thus forming a speed variation parameter,
    c) measuring a maximum value of the motor current, thus forming a maximum current parameter,
    d) measuring a motor current in the steady state, thus forming a running current parameter,
    e) measuring a motor vibration energy in the steady state, thus forming a vibration energy parameter, and
    f) determining when the motor is acceptable based on the time-to-speed parameter, the speed variation parameter, the maximum current parameter, the running current parameter and the vibration energy parameter, the acceptability determining step f) including:
        f1) for each parameter of the set of parameters comprising time-to-speed, speed variation, maximum current, running current and vibration energy, based on the measured value of the parameter, classify the parameter into one or two catagories, the one or two categories being members of a predetermined set of categories, each members of the set of categories having a predetermined weight factor corresponding thereto;
        f2) for each parameter classified into one category, determine a degree of membership in the category, and for each parameter classified into two categories comprising a first category and a second category, determine a first degree of mambership in the first category and a second degree of memebership in the second category;
        f3) for each parameter classified onto one category, form a weighted acceptability factor based on the degree of membership and the weight factor corresponding to the category, and for each parameter classified into two categories, form a first weighted acceptability factor based of the first degree of membership and the weight factor corresponding to the first category and a second weighted acceptability factor based on the second degree of membership and the weight factor corresponding to the second category;
        f4) sum all weighted acceptability factors formed in f2) and f3), thus forming a composite acceptability score for the motor;
        f5) compare the composite acceptability score with a threshold score, thus forming a comparison; and
        f6) determine when the motor is acceptable based on the comparison.

11. The method of claim 10, where the classification step f1) and the summing step f4) are based on fuzzy logic.

12. In a testing apparatus arranged for coupling to a motor, the motor including a motor current, a method for determining when the motor is acceptable, the method comprising:
    a) measuring a time required for the motor to reach a running speed in a steady state, thus forming a time-to-speed parameter,
    b) measuring a difference between an instantaneous speed and an average speed in the steady state, thus forming a speed variation parameter, c) measuring a maximum value of the motor current, thus forming a maximum current parameter, d) measuring a motor current in the steady state, thus forming a running current parameter, e) measuring a motor vibration energy in the steady state, thus forming a vibration energy parameter;

f) measuring a motor current energy in the steady state, thus forming a current energy parameter; and g) determining when the motor is acceptable based on the time-to-speed parameter, the speed variation parameter, the maximum current parameter, the running current parameter, the vibration energy parameter and the current energy parameter.

13. The method of claim 12, the current energy measuring step f) including measuring a band current energy for each frequency band of a predetermined set of frequency bands.

14. The method of claim 13, the band current energy comprising a total band current energy.

15. The method of claim 13, the predetermined set of frequency bands comprising an arbitrary quantity of frequency bands.

16. The method of claim 15, the band current energy including an average band current energy based on an average current energy of the each frequency band.

17. The method of claim 15, the band current energy including a peak band current energy based on current energy peaks of the each frequency band.

18. The method of claim 12, the current energy measuring step f) including measuring a spectrum current energy for a predetermined frequency spectrum.

19. The method of claim 18, the spectrum current energy including a peak spectrum current energy based on current energy peaks of the frequency spectrum.

20. The method of claim 18, the spectrum current energy including a maximum spectrum current energy based on the maximum current energy of the frequency spectrum.

21. In a testing apparatus arranged for coupling to a motor, the motor including a motor current, a method for determining when the motor is acceptable, the method comprising:

a) measuring a time required for the motor to reach a running speed in a steady state, thus forming a time-to-speed parameter, b) measuring a difference between an instantaneous speed and an average speed in the steady state, thus forming a speed variation parameter, c) measuring a maximum value of the motor current, thus forming a maximum current parameter, d) measuring a motor current in the steady state, thus forming a running current parameter, e) measuring a motor vibration energy in the steady state, thus forming a vibration energy parameter;

f) measuring a motor current energy in the steady state, thus forming a current energy parameter; and g) determining when the motor is acceptable based on the time-to-speed parameter, the speed variation parameter, the maximum current parameter, the running current parameter, the vibration energy parameter and the current energy parameter, the acceptability determining step g) including the steps of:

g1) for each parameter of the set of parameters comprising time-to-speed, speed variation, maximum current, running current, vibration energy and current energy, based on the measured value of the parameter, classify the parameter into one or two categories, the one or two categories being members of a predetermined set of categories, each member of the set of categories having a predetermined weight factor corresponding thereto;

g2) for each parameter classified into one category, determine a degree of membership in the category, and for each parameter classified into two categories comprising a first category and a second category, determine a first degree of membership in the first category and a second degree of membership in the second category;

g3) for each parameter classified into one category, form a weighted acceptability factor based on the degree of membership and the weight factor corresponding to the category, and for each parameter classified into two categories, form a first weighted acceptability factor based on the first degree of membership and the weight factor corresponding to the first category and a second weighted acceptability factor based on the second degree of membership and the weight factor corresponding to the second category;

g4) sum all weighted acceptability factors formed in g2) and g3), thus forming a composite acceptability score for the motor;

g5) compare the composite acceptability score with a threshold score, thus forming a comparison; and g6) determine when the motor is acceptable based on the comparison.

22. The method of claim 21, where the classification step g1) and the summing step g4) are based on fuzzy logic.

23. In a testing apparatus arranged for coupling to a motor, a method for determining the remaining life of a motor, the method comprising:

a) measuring a time required for the motor to reach a running speed in a steady state, thus forming a time-to-speed parameter, b) measuring a difference between an instantaneous speed and an average speed in the steady state, thus forming a speed variation parameter, c) measuring a maximum value of the motor current, thus forming a maximum current parameter, d) measuring a motor current in the steady state, thus forming a running current parameter, e) measuring a motor vibration energy in the steady state, thus forming a vibration energy parameter, and f) determining when the motor is acceptable based on the time-to-speed parameter, the speed variation parameter, the maximum current parameter, the running current parameter and the vibration energy parameter.

24. The method of claim 23, the acceptability determining step f) including:

f1) for each parameter of the set of parameters comprising time-to-speed, speed variation, maximum current, running current and vibration energy, based on the measured value of the parameter, classify the parameter into one or two categories, the one or two categories being members of a predetermined set of categories, each member of the set of categories having a predetermined weight factor corresponding thereto;

f2) for each parameter classified into one category, determine a degree of membership in the category, and for each parameter classified into two categories comprising a first category and a second category, determine a first degree of membership in the first category and a second degree of membership in the second category;

f3) for each parameter classified into one category, form a weighted acceptability factor based on the degree of membership and the weight factor corresponding to the category, and for each parameter classified into two categories, form a first weighted acceptability factor based on the first degree of membership and the weight factor corresponding to the first category and a second weighted acceptability factor based on the second degree of membership and the weight factor corresponding to the second category;

f4) sum all weighted acceptability factors formed in f2) and f3), thus forming a composite acceptability score for the motor;

f5) compare the composite acceptability score with a threshold score, thus forming a comparison; and f6) determine when the motor is acceptable based on the comparison.

25. The method of claim 24, where the classification step f1) and the summing step f4) are based on fuzzy logic.

26. In a testing apparatus arranged for coupling to a motor, a method for determining the remaining life of a motor, the method comprising:

a) measuring a time required for the motor to reach a running speed in a steady state, thus forming a time-to-speed parameter, b) measuring a difference between an instantaneous speed and an average speed in the steady state, thus forming a speed variation parameter, c) measuring a maximun value of the motor current, thus forming a maximum current parameter;

d) measuring a motor current in the steady state, thus forming a running current parameter, e) measuring a motor vibration energy in the steady state, thus forming a vibration energy parameter;

f) measuring a motor current energy in the steady state, thus forming a current energy parameter; and g) determining when the motor is acceptable based on the time-to-speed parameter, the speed variation parameter, the maximum current parameter, the running current parameter, the vibration energy parameter and the current energy parameter.

27. The method of claim 26, the acceptability determining step g) including the steps of:

g1) for each parameter of the set of parameters comprising time-to-speed, speed variation, maximum current, running current, vibration energy and current energy, based on the measured value of the parameter, classify the parameter into one or two categories, the one or two categories being members of a predetermined set of categories, each member of the set of categories having a predetermined weight factor corresponding thereto;

g2) for each parameter classified into one category, determine a degree of membership in the category, and for each parameter classified into two categories comprising a first category and a second category, determine a first degree of membership in the first category and a second degree of membership in the second category;

g3) for each parameter classified into one category, form a weighted acceptability factor based on the degree of membership and the weight factor corresponding to the category, and for each parameter classified into two categories, form a first weighted acceptability factor based on the first degree of membership and the weight factor corresponding to the first category and a second weighted acceptability factor based on the second degree of membership and the weight factor corresponding to the second category;

g4) sum all weighted acceptability factors formed in g2) and g3), thus forming a composite acceptability score for the motor;

g5) compare the composite acceptability score with a threshold score, thus forming a comparison; and g6) determine when the motor is acceptable based on the comparison.

28. The method of claim 27, where the classification step g1) and the summing step g4) are based on fuzzy logic.

* * * * *